United States Patent
Theriault et al.

(10) Patent No.: US 6,530,732 B1
(45) Date of Patent: *Mar. 11, 2003

(54) SINGLE SUBSTRATE LOAD LOCK WITH OFFSET COOL MODULE AND BUFFER CHAMBER

(75) Inventors: Victor J. Theriault, Beverly, MA (US); Mark Ives, Merrimack, NH (US)

(73) Assignee: Brooks Automation, Inc., Chelmsford, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/084,457

(22) Filed: May 26, 1998

Related U.S. Application Data

(60) Provisional application No. 60/055,329, filed on Aug. 12, 1997.

(51) Int. Cl.[7] ............................................. B65G 1/133
(52) U.S. Cl. ..................... 414/217; 165/80.1; 165/80.2; 165/61; 165/206; 118/719; 118/724; 118/725; 118/729; 204/298.07; 204/298.25; 204/298.26; 414/935; 414/936; 414/939; 156/345
(58) Field of Search .............................. 165/206, 80.1, 165/80.2, 80.4, 80.5, 61; 414/217, 935, 936, 939; 156/345; 118/724, 725, 719; 204/298.07, 298.09, 298.25, 298.26, 298.15, 298.27

(56) References Cited

U.S. PATENT DOCUMENTS

| | | | | |
|---|---|---|---|---|
| 4,816,638 A | * | 3/1989 | Ukai et al. .................. 156/345 |
| 4,944,645 A | * | 7/1990 | Suzuki ....................... 414/217 |
| 5,002,010 A | * | 3/1991 | Weinberg ................... 118/724 |
| 5,223,001 A | * | 6/1993 | Saeki ........................ 414/217 |
| 5,240,505 A | * | 8/1993 | Iwasaki et al. ............. 118/724 |
| 5,445,484 A | * | 8/1995 | Kato et al. .................. 414/217 |
| 5,445,491 A | * | 8/1995 | Nakagawa et al. ......... 414/217 |
| 5,512,320 A | * | 4/1996 | Turner et al. ............... 118/725 |
| 5,609,689 A | * | 3/1997 | Kato et al. .................. 156/345 |
| 5,613,776 A | * | 3/1997 | Turner et al. ................ 165/61 |
| 5,664,925 A | * | 9/1997 | Muka et al. ................ 414/217 |
| 5,778,968 A | * | 7/1998 | Hendrickson et al. ..... 165/80.1 |
| 5,795,399 A | * | 8/1998 | Hasegawa et al. .......... 156/345 |
| 5,855,681 A | * | 1/1999 | Maydan et al. ............. 118/719 |
| 5,879,461 A | | 3/1999 | Adams ....................... 118/724 |
| 5,882,413 A | * | 3/1999 | Beaulieu et al. ............ 156/345 |
| 5,909,994 A | | 6/1999 | Blum et al. ................. 414/217 |
| 5,913,978 A | * | 6/1999 | Kato et al. .................. 414/217 |
| 5,934,856 A | * | 8/1999 | Asakawa et al. ........... 414/217 |
| 6,059,507 A | * | 5/2000 | Adams .................... 414/217.1 |
| 6,079,928 A | * | 6/2000 | Theriault et al. ........... 118/719 |
| 6,231,289 B1 | * | 5/2001 | Theriault et al. ........... 414/217 |

FOREIGN PATENT DOCUMENTS

| | | |
|---|---|---|
| WO | WO/95/16800 | 6/1995 |
| WO | WO99/02752 | 1/1999 |

\* cited by examiner

*Primary Examiner*—John K. Ford
(74) *Attorney, Agent, or Firm*—Perman & Green, LLP

(57) ABSTRACT

A load lock and related method of handling a substrate involves placing a substrate onto a vertically movable poppet and moving the poppet between two vertically opposed subchambers such that in moving the poppet toward one of the subchambers, that subchamber is sealed to atmosphere. The two subchamber system allows one substrate to be placed into a buffer and another substrate to be cooled at the same time. Also, the system allows for a slow vacuum to be made on the substrate in a subchamber to avoid undesirably loading the substrate by the otherwise immediate drop in pressure.

17 Claims, 11 Drawing Sheets

SINGLE SUBSTRATE LOAD LOCK WITH OFFSET COOL MODULE AND BUFFER CHAMBER

BACKGROUND OF THE INVENTION

This application is based upon copending provisional application Ser. No. 60/055,329 filed on Aug. 12, 1997, on which application priority of the present application is based.

FIELD OF THE INVENTION

The apparatus of the present invention relates generally to material transfer devices and more particularly to an improved method and article of handling substrates within a substrate transport.

The material transferred might include, but not be limited to, semiconductor wafers, such as silicone and gallium arsenide, semiconductor packaging substrates, such as high density interconnects, semiconductor manufacturing processing imaging plates, such as masks or reticles, and large area displayed panels, such as active matrix LCD substrates.

The need for high throughput transport devices which can move a substrate or workpiece between remote locations within a highly confined footprint such as found in the manufacture of wafers or panels or the like used in the semiconductor industry is in high demand. This is because in the process of manufacturing such panels, wafers or the like, the need to move a workpiece from one position to the next not only requires that a high throughput rate be achieved, but also that maximum throughput between component elements of the tool is achieved. In this way, processing time for a given number of substrates can be maximized for a given tool.

Copending U.S. patent application Ser. No. 08/654,334 filed in the name of Hendrickson, filed on May 28, 1996 and entitled A System for Heating or Cooling Wafers and U.S. Pat. No. 5,588,827 entitled A Passive Gas Substrate Thermoconditioning Apparatus and Method, issued on Dec. 31, 1996 to Richard Muka, disclose a substrate transport having a main vacuum transport chamber to which a temperature transfer station is mounted. Thus, it is known in the art to connect an individual substrate thermoconditioning module to a side of the substrate transport outside of the main transport chamber. Also, in copending U.S. patent application Ser. No. 08/891,532 filed under Express Mail No. EM029241165 US and entitled A Substrate Processing Apparatus Having A Substrate Transport with a Front End Extension and an Internal Substrate Buffer, filed on Jul. 11, 1997 in the name of David Beaulie and Michael W. Pippins, now U.S. Pat. No. 5,882,413, discloses a method and apparatus for forming an integrated platform in which a wafer cooler is provided. However, the device disclosed in this patent application has an extended footprint as it uses separate elements, namely, a cooler 36, a buffer, and load locks to effect three different functions for the three separate elements. However, the fabrication and usage of the three elements occupies much needed additional footprint space which otherwise could be used for other process modules and/or cluster tools in the substrate fabrication process.

Accordingly, it is an object of the invention to provide a single substrate load lock with offset cool module and buffer chamber which is capable of transporting substrates from an external environment to a vacuum environment for processing and then back to a factory interface in a manner such that no damage occurs due to thermal shock or nonuniformity in the substrate.

Another object of the invention is to provide a substrate load lock of the aforementioned type wherein the cost of fabrication is reduced by efficiency of the design and construction.

Still a further object of the invention is to provide a substrate load lock of the aforementioned type which is reduced in complexity of drive mechanisms and controls.

It is still a further object of the invention to provide substrate load lock of the aforementioned type which reduces vacuum volume thereby reducing the amount of pumping capability required to maintain adequate vacuum in the system.

Yet still a further object of the invention is to provide a substrate load lock of the aforementioned type wherein the manufacturing time, complexity of construction, alignment in time testing are reduced.

Further still an object of the invention is to provide a substrate load lock of the aforementioned type wherein service and reliability as well as reduced system time throughput are enhanced.

SUMMARY OF THE INVENTION

The invention resides in the single substrate load lock with offset cool module and buffer chambers. The load lock is provided as an interface to a substrate handling transport system via a vacuum isolation slot valve. The load lock allows for a single substrate transition from an external environment to the vacuum environment of the transport chamber while a second substrate may reside either in the buffer chamber or the cooling chamber. In either case, with or without a substrate in the buffer or cooling chambers, the load lock is adapted and is configured to provide a throughput mode wherein a substrate is loaded into the load lock from the outside without interfering with a substrate placed either in the buffer chamber or in the cooling chamber.

The invention further relates to a method of handling a substrate in a cluster tool wherein a load lock with a cool down chamber and a buffer chamber is provided and is in selective vacuum communication with a transfer chamber associated with one valve and a second valve associated with an external environment. Thus, the system provides a reduced impact from vacuum to substrates as each is exposed to vacuum when moved from an external environment and vice versa. It is preferred to open the external valve to the external environment only when a substrate is sealed within one of the subchambers by either upward or downward movement of the poppet. In other words, the load lock configuration allows for fast venting only of empty areas where no substrate is disposed, but venting in the sealed subchambers is, rough or staggered, thus avoiding shocking the substrate.

More specifically, the invention resides in a typical sequence whereby a processed substrate is moved into the load lock and onto the holding members of the poppet, the poppet is lowered into subchamber and interior valve is closed. Fast evacuation of the main chamber and subchamber (empty) next begins. Next, cooling in a subchamber may take place. The external environment valve is opened and a new substrate is placed onto the poppet. The poppet is raised. Slow rough evacuation of the subchamber with the new substrate held therein is accomplished. Removal of cooled substrate from the poppet next occurs. The external environment valve is next closed. Fast evacuation of all chambers occurs and the internal valve is opened. The transport apparatus places a processed substrate onto the poppet. The poppet is next lowered. The transport apparatus may pick or place another substrate from the poppet if appropriate, and the internal valve is closed.

DETAILED DESCRIPTION OF THE PREFERRED EMBODIMENTS

Figure 1:
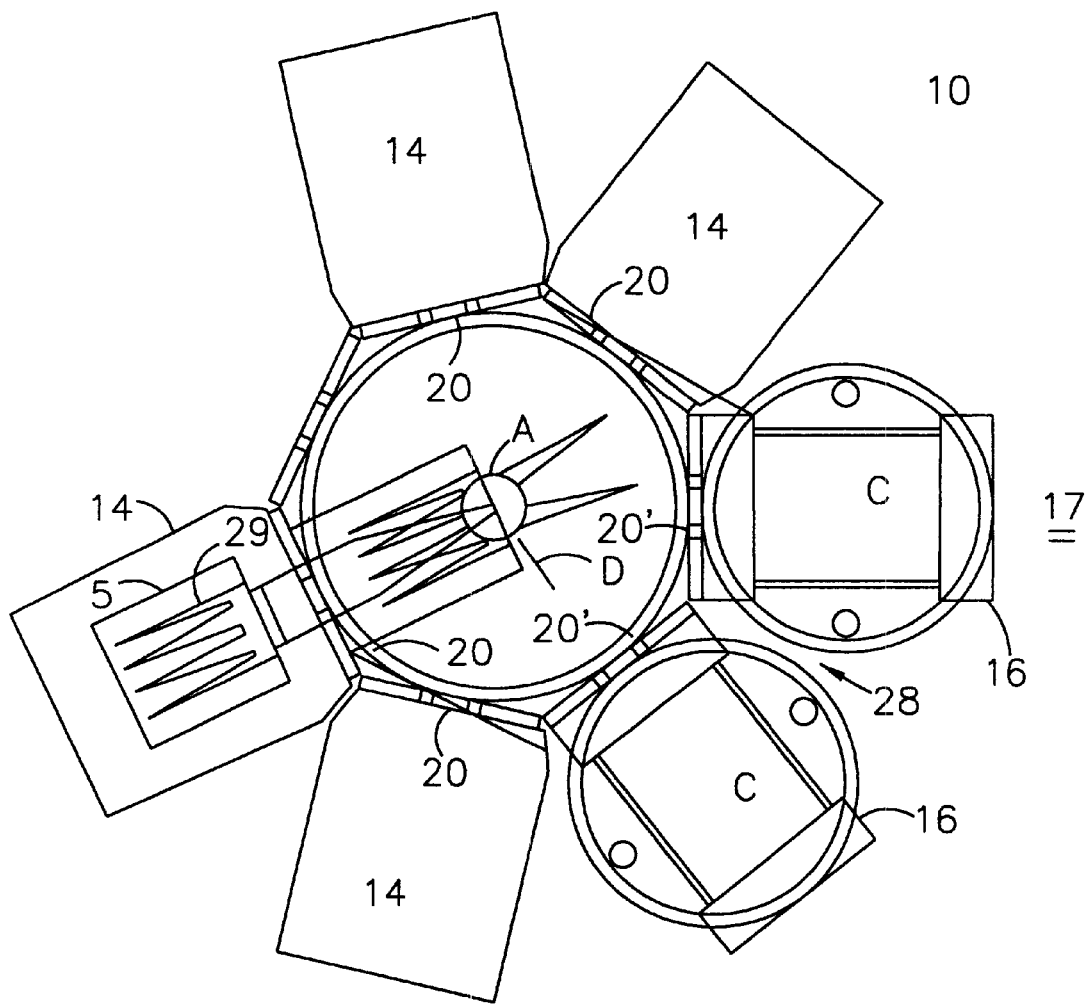
FIG. 1 is a top plan view of a substrate processing apparatus shown schematically incorporating the features of the present invention.

Referring to FIG. 1, there is shown a schematic top plan view of a substrate processing apparatus 10 incorporating features, of the present invention. Although the present invention will be described with reference to the single embodiment shown in the drawings, it should be understood that the present invention can be embodied in many alternate forms of embodiments. In addition, any suitable size, shape or type of elements or materials could be used.

The apparatus 10 includes a main section 12, substrate processing modules 14, substrate load lock modules 16, and an external environment 17. The environment 17 may include means for holding cassettes of substrates and a robot (not shown) for moving the substrates into and out of the load locks 16. In alternate embodiments, any suitable substrate loading system, manual and/or automatic computer controlled, could be used for loading substrates into the load locks 16.

Figure 2:
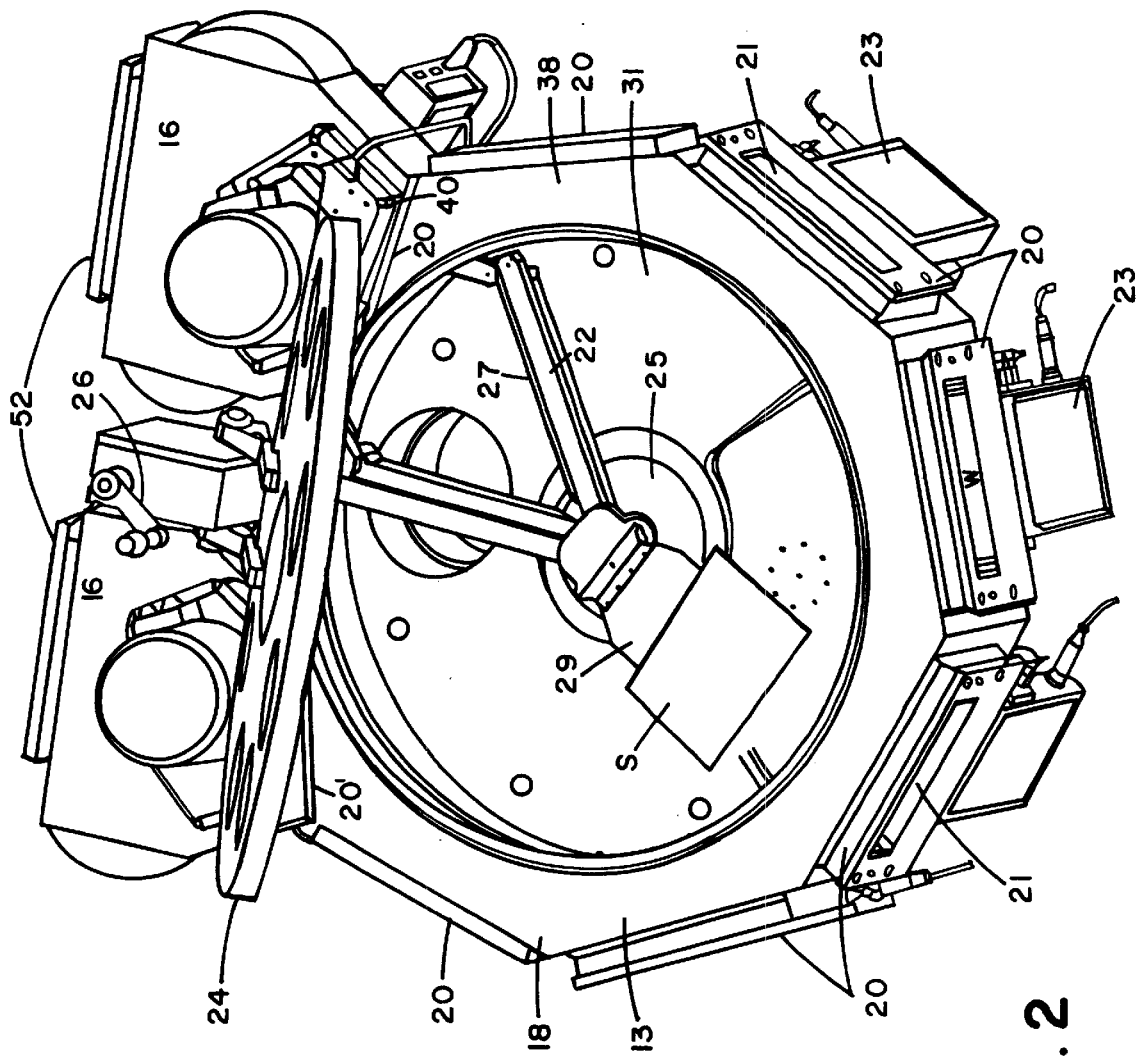
FIG. 2 is a perspective view of the main section of the apparatus shown in FIG. 1.

Referring also to FIG. 2, a perspective view of the main section 12 is shown. The cover 24 is shown in an up position for illustration purposes. During normal operation, the cover 24 is closed and sealed on top of the frame 18. The main section 12 is a substrate transport having a housing 13 and a substrate transport mechanism 22. The housing 13 has a frame 18 with multiple side apertures having door sections 20,20'. The modules 14, 16 are connected to the door sections 20,20'. The door sections 20 have doorways 21 with movable door mechanisms or valves to open and close the doorways. The substrate processing modules 14 and the load lock modules 16 are well known in the art. The substrates S could be semi-conductor wafers, flat panel display substrates, or any other type of substrate. The substrate transport mechanism 22 is provided for moving the substrates S among the modules 14, 16.

The substrate transport mechanism 22 has a drive section 25, a movable arm section 27 and two substrate holders 29. The holders 29 can be moved through the doorways 21 into and out of the modules 14, 16 to move the substrate S into and out of the modules 14, 16. A similar substrate transport mechanism is described PCT patent publication No. WO 94/23911 (corresponds to U.S. Pat. No. 5,720,590) which is hereby incorporated by reference in its entirety. However, any suitable type of substrate transport mechanism can be used. The housing 13 includes the movable top cover 24 and a cover movement crank 26. The front end 28 of the housing 13 has one or more load locks 16, 16. The term "front end" is used merely for descriptive purposes. The extended section could be located on any side of the housing, could be spaced from paths to and from the load locks, and/or could comprise multiple extended sections. Depending on the application, see copending U.S. Applications Ser. Nos. 60/055,332 (provisional of) 09/084,754 filed concurrently herewith and entitled, A Dual Plate Gas Assisted Degas Module, herein incorporated by reference, one of the modules 14 could be defined by the structure disclosed therein, while the load lock(s) may be defined by the structure of the present application. Thus, the substrate handler load locks 16, 16 and the modules 14 could include a substrate degas/pre-heater, a combined substrate heater/cooler, cooler or heater/cooler, or any other suitable type of substrate handler.

The load locks 16, 16 connect directly to the housing 13 so as to extend outwardly at an angle so as to allow the nearby substrate processing modules 14 to be angled and positioned as shown. This helps to orientate all of the substrate processing modules at efficient locations and spacings with the main section 12. The front section 28 being defined by load locks 16,16, is comprised of separate pieces removably connected to the rest of the frame 18, or alternatively could be formed integrally with the front end of the housing 12. What is desired is that the front section as defined by one or more of the load locks 16,16 have a chamber(s) which are in selective vacuum communication with the main chamber 31. The general length D as measured from the substrate load lock center C in each load lock 16, 16 to the axis A of rotation of the transport mechanism 22 of the front extended section 30 is sufficiently short to allow the movable arm section 27 of the transport mechanism 22 to pass through the valves 20',20' associated with the front section of the housing 13 and into the load locks 16,16. The housing 13 forms a main transport chamber 31 therein.

The main transport chamber 31 has the movable arm section 27 therein and the doorways 21 are located at the outer perimeter of the chamber 31. The chamber 31 is maintained as a substantially closed environment. The valves 20,20' at the doorways 21 can be temporarily opened for inserting and removing substrates with the modules 14, 16. Preferably, the main chamber 31 is maintained in a vacuum. However, the main chamber 31 could alternatively be filled with an inert gas.

Figure 3:
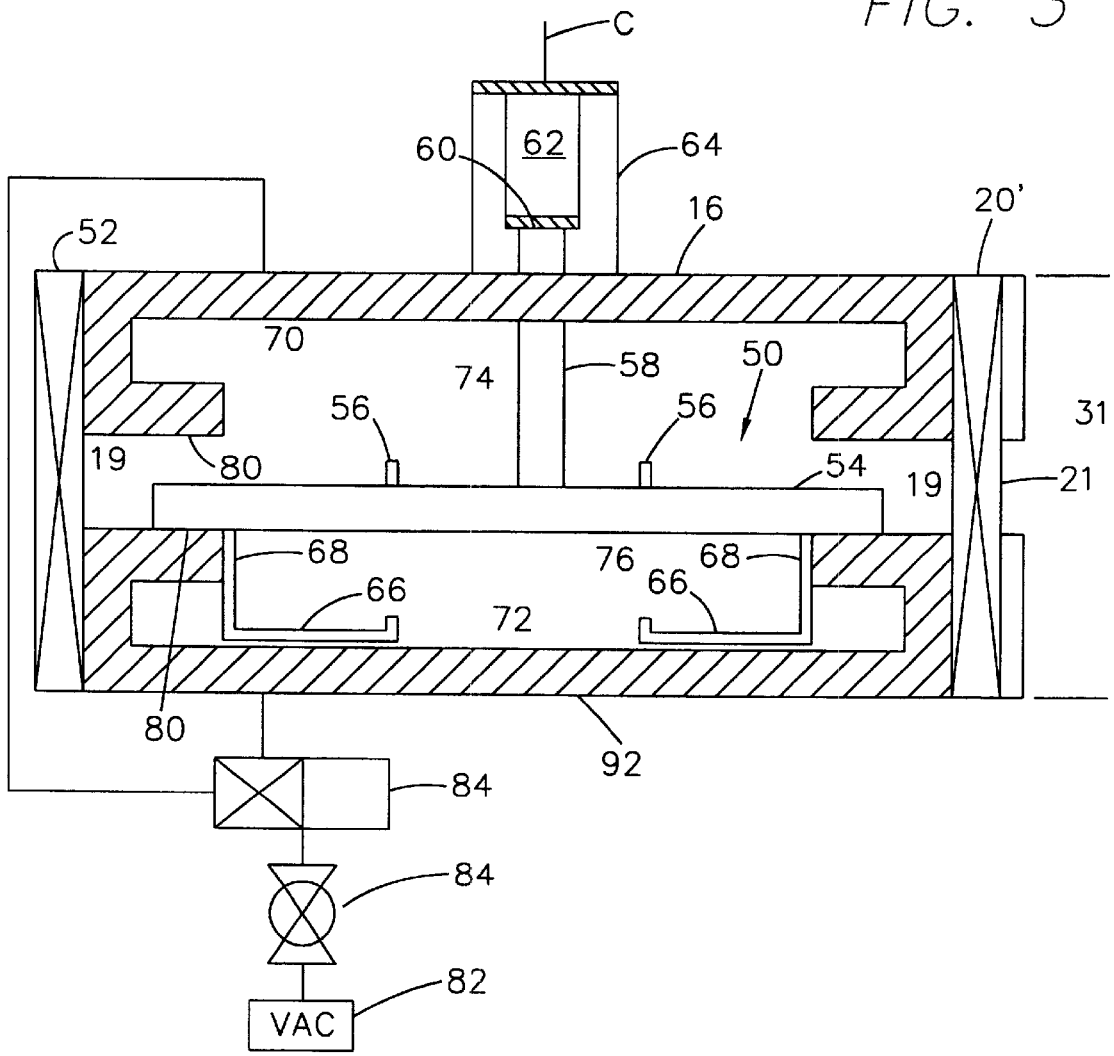
FIG. 3 is a partial fragmentary vertical section taken through the load lock of the present invention showing the substrate platen in its down position.
Figure 4:
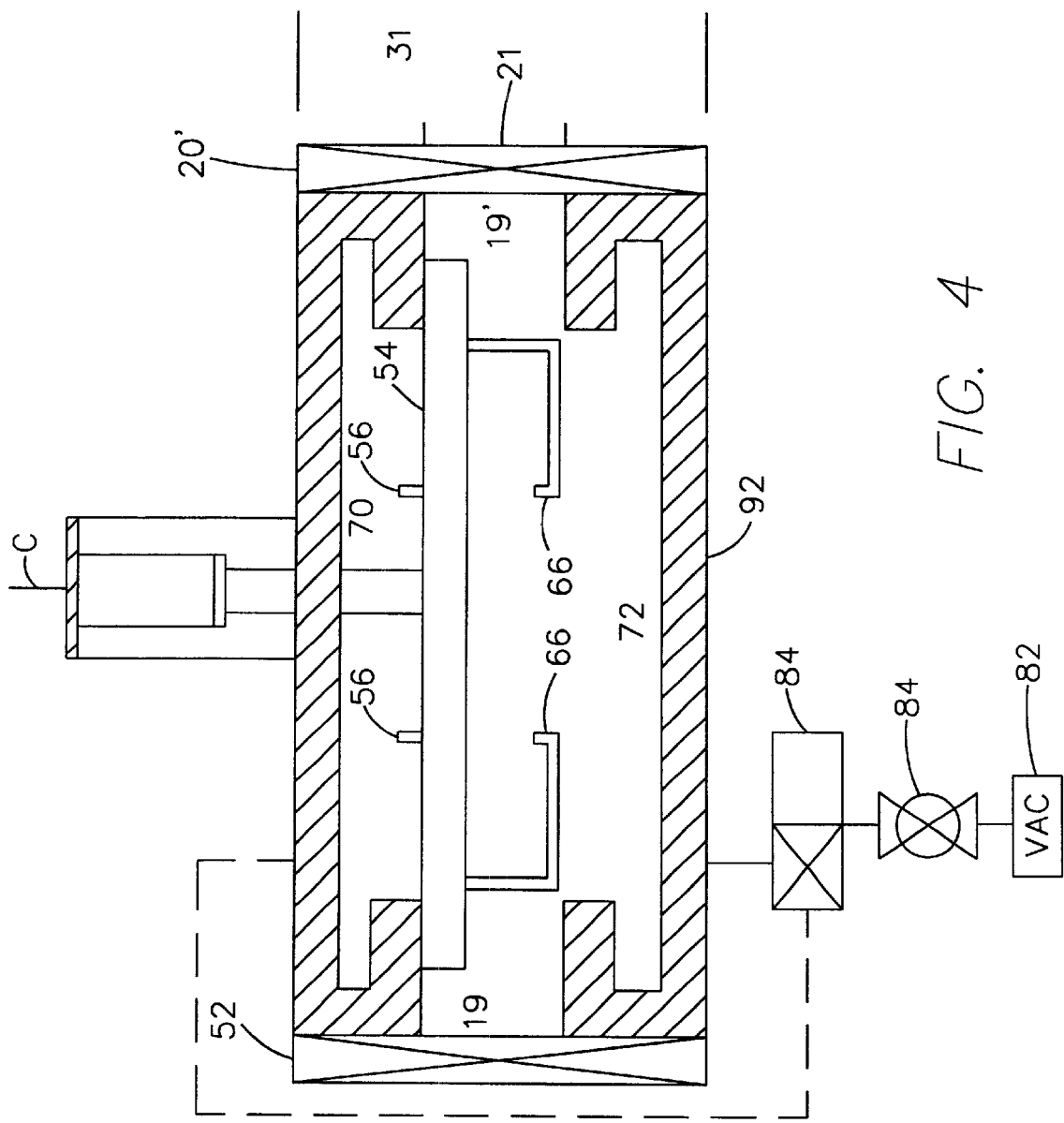
FIG. 4 is a partially fragmentary vertical section taken through the load lock of the invention showing the substrate poppet in its vertically up condition.

Referring now to FIGS. 3 and 4, and in particular to the load lock 16,16 of the invention, it should be seen that the load locks 16 are provided with two valves, the first of which as discussed previously is valve 20' which is disposed intermediate the internal chamber 31 of the transport mechanism 22 and an internal chamber 50 of the load lock. Opposite the valve 20' is a similar valve 52 which is associated with the external environment 17 and an aperture 19 in the load lock. A like aperture 19' exists at the other end of the load lock adjacent the valve 20'.

Figure 5:
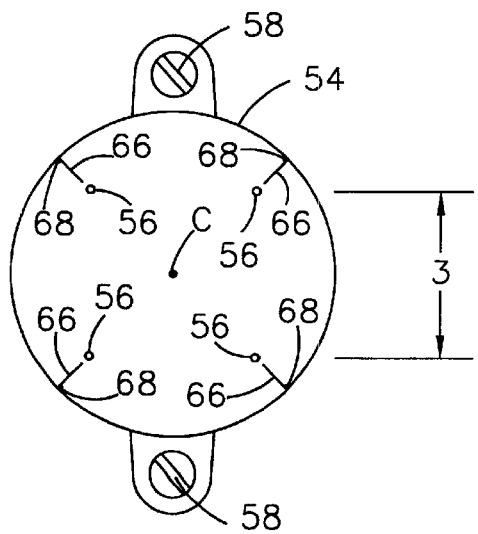
FIG. 5 is a bottom view of the poppet.

Vertically movably disposed within the chamber 50 of the load lock 16 is a generally circular planar support member or poppet 54 having upstanding standoffs 56 for mounting a substrate thereon. Opposite sides of the poppet 54 are connected respectively with two vertically movable rods 58,58 which are connected to one another via a horizontally disposed transverse bar 60 which is in turn moved by an actuator 62 secured to a cantilevered post member 64 which is mounted to the top of the load lock 16. Depending from the poppet 54 are a plurality of inwardly directed holding pins 66,66 with depending portions 68 fixedly secured to the undersurface of the poppet 54. Referring for the moment to FIG. 5, it should be seen that the depending portions 68,68 of the holding pins 66 are located laterally outwardly beyond the width W of the doorway/port 19',21 associated with the valve 20' such that the substrate S passes freely through and into the chamber 50 without interference from the depending portions 68 when the poppet 54 is in the upwardly raised condition.

The chamber 50 of the load lock 16 is defined by two working subchambers. The first of which subchambers is defined by an upper buffer chamber 70 located at the top portion of the chamber 50 and a lower thermal chamber 72. Each of the subchambers 70 and 72 is defined by a circular opening 74, 76 respectively, in communication with the chamber 50. Disposed about each of the openings 74 and 76 is an annular gasket 80,80 which is capable of sealing each of the subchambers in the manner which will be discussed in greater detail later. As is illustrated in the drawings, the diameter of the circular poppet 54 is greater than the diameter of the openings 74 and 76 formed in the housing of the load lock 16. Thus, as the poppet 54 is moved between vertical up and vertical down positions as shown respectively in FIGS. 4 and 3, the force applied in each such direction by the actuator 62 is sufficient to cause sealing by one of the corresponding upper and lower surfaces of the poppet 54 with a juxtaposed one of the annular gaskets 80,80 fixed to the load lock housing about each of the openings 74 and 76. As such, it should be understood that each of the subchambers 70 and 72 is capable of being sealed relative to the remainder of the chamber 50 by virtue of the vertical movement of the poppet 54. In other words, the movement of the poppet 54 between vertically up and down positions causes the poppet to behave like an isolation valve between the two subchambers 70 and 72.

Communicating with both the lower subchamber 72 and the upper subchamber 70 is a vacuum pump 82 which is responsible for evacuating the entire chamber 50 or only one of the subchambers 70, 72. The vacuum pump 82 is connected to both subchambers 70 and 72 through a rough out valve 84. The base of the subchamber 70 is provided with a cooling plate 92 disposed therein. The cooling plate 92 is connected to a heat transfer device and is responsible for drawings off heat from substrates which require cool down prior to being transferred out of the load lock and to the external environment or require cool down before entering another processing step within the apparatus 10.

In operation, the subchamber 70 would serve as a buffer station for a single substrate to reside in vacuum while a second substrate is either loaded from the external environment or is moved from the internal confines of the chamber 31 and placed onto the holders 66 which depend from the poppet 54. It is a further feature of the invention to provide vacuum in selective communication with the subchambers 70 and 72 for evacuating air from one such subchamber while leaving the other such subchamber open to the external environment. Thus, for example, once the poppet is raised to its vertically closed condition, such as in the example where a substrate is loaded from the external environment through the valve 52 and onto the depending holding members 66,66, the upper subchamber 70 may remain in vacuum with the remainder of the chamber 50 being exposed to a different pressure. Conversely, if desired, the poppet may be moved to its vertical down condition thereby sealing the lower subchamber 72 and allowing the remainder of the chamber 50 to be exposed to the external environment. Thus, when the poppet is raised to its upward condition, the subchamber 70 can be independently evacuated and when the poppet is lowered, the subchamber 72 can be independently evacuated. During such modes of operation where the external environment valve 52 is opened, it is understood that the valve 20' is in its closed condition barring the exposure of the main chamber 31 to the external environment.

It is a feature of the invention to provide a reduced impact from vacuum to substrates as each is exposed to vacuum from the external environment and vice versa. Thus, it is preferred to open the external valve 52 to the external environment only when a substrate is sealed within one of the subchambers 70, 72 by either upward or downward movement of the poppet.

In other words, the load lock configuration of the present invention allows for fast venting only of areas of the chamber 50 in which no substrate is disposed, but in the sealed subchambers, only rough or staggered occurs, thus avoiding shocking the substrate.

Figure 6A:
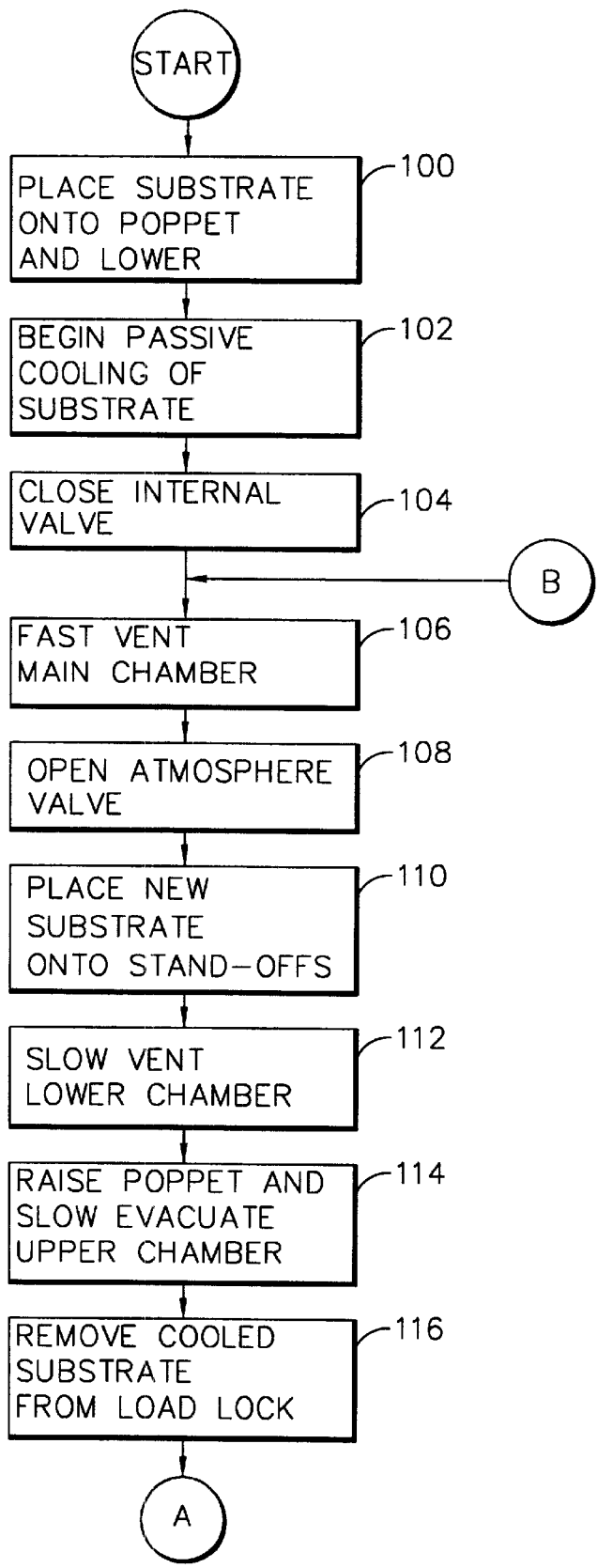
FIGS. 6a and 6b when combined are a flow chart of one scheme which is capable of being employed by the load lock of the invention.
Figure 6B:
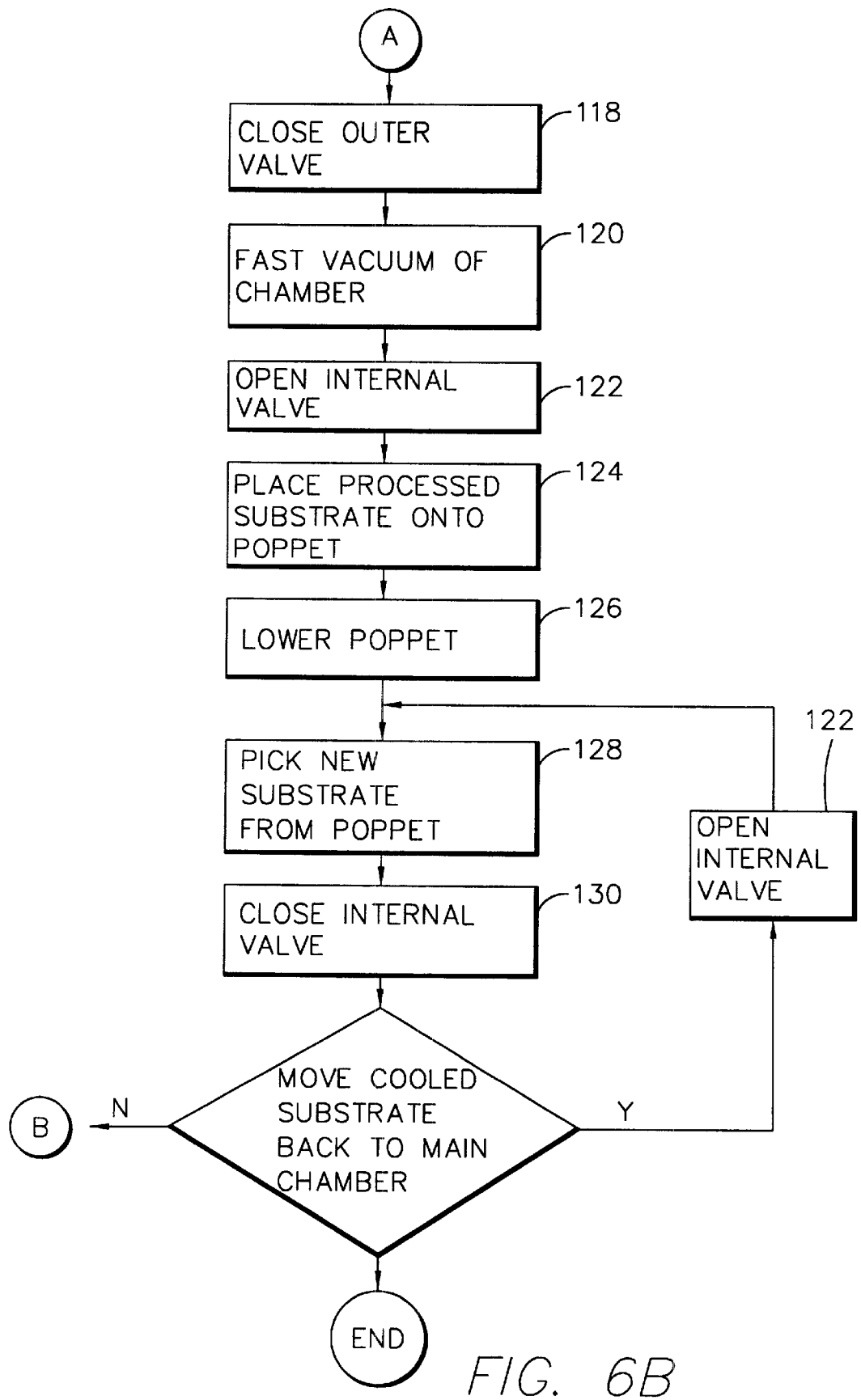

A typical sequence would be as set forth in the flow diagram of FIGS. 6a and 6b.

A processed substrate is moved into the load lock 16 from the main chamber 31 and is placed onto the depending holding members 66, the poppet is lowered into subchamber 72 and interior valve 20' is closed. (step 100)

Figure 7A:
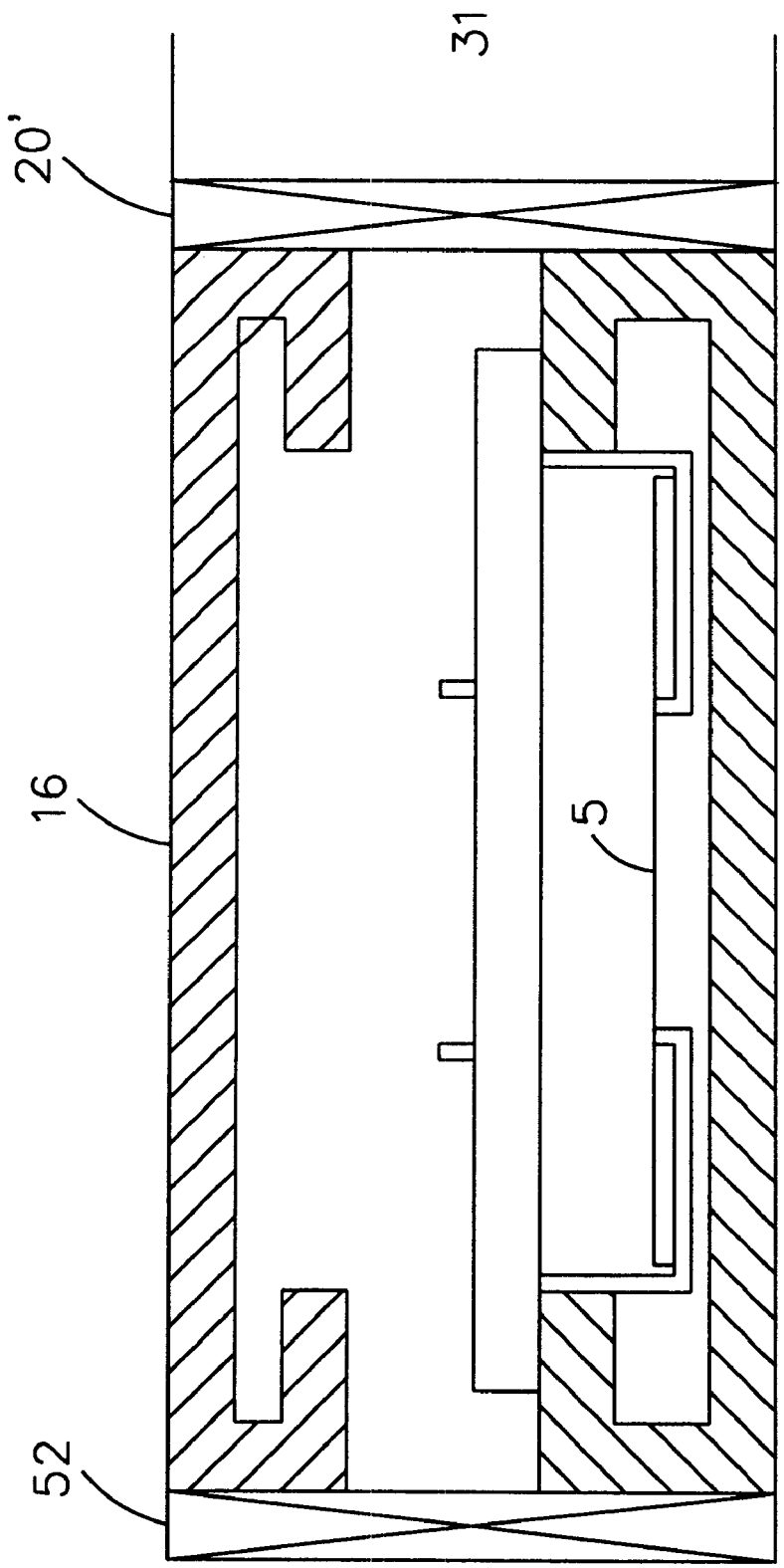
FIGS. 7a–7d show schematically various stages of the poppet support during one process of the invention.

Cooling begins, see FIG. 7a. (step 102)

Close internal valve 20'. (step 104)

Fast venting of chamber 50 and subchamber 70 (empty) begins. (step 106)

External environment valve 52 is opened. (step 108)

Figure 7B:
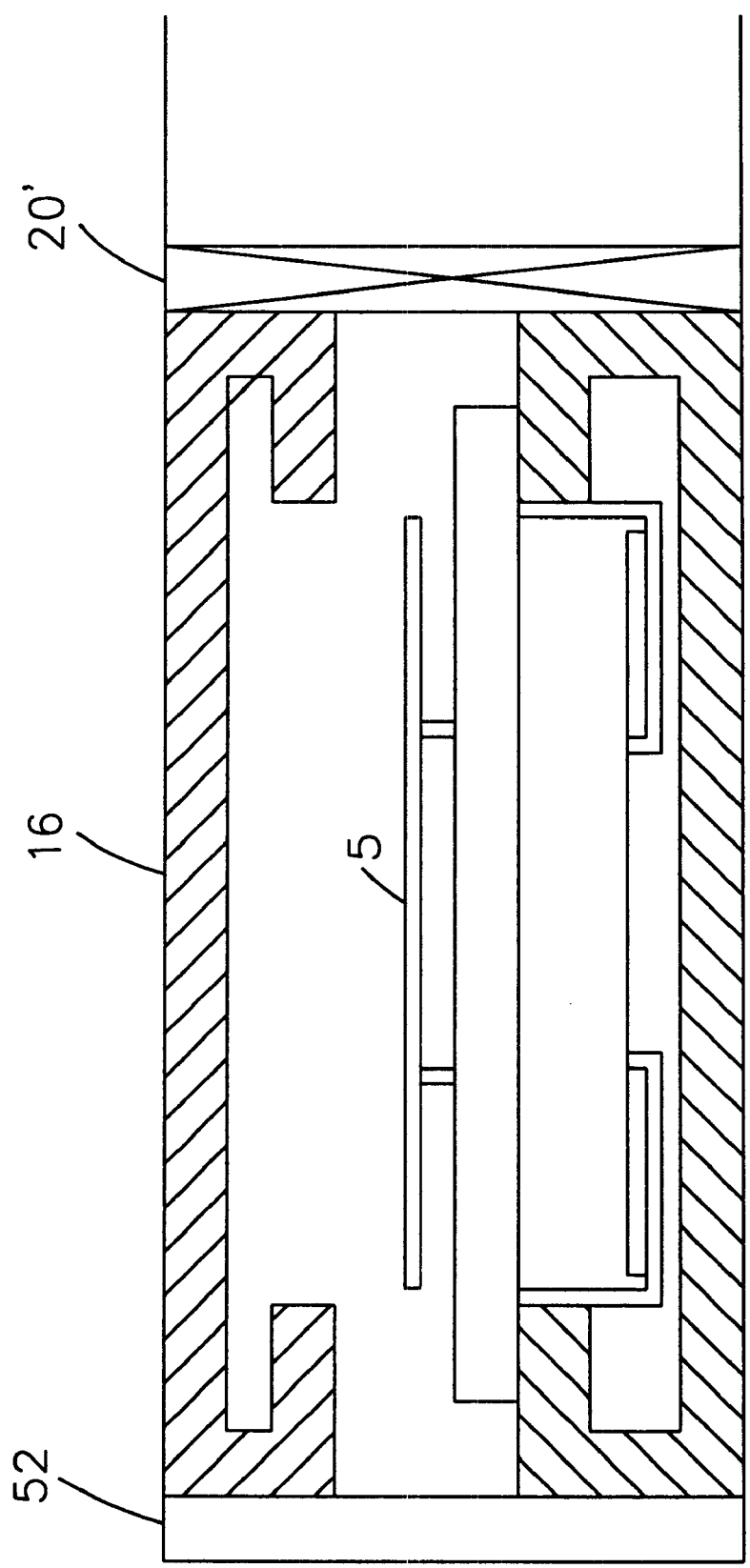

Place new substrate onto stand offs 56, see FIG. 7b. (step 110)

Slow vent lower chamber. (step 112)

Raise poppet 54 and slow rough evacuation of subchamber 70 with new substrate held therein. (step 114)

Remove cooled substrate from poppet through valve 52. (step 116)

Close atmospheric valve 52. (step 118)

Figure 7C:
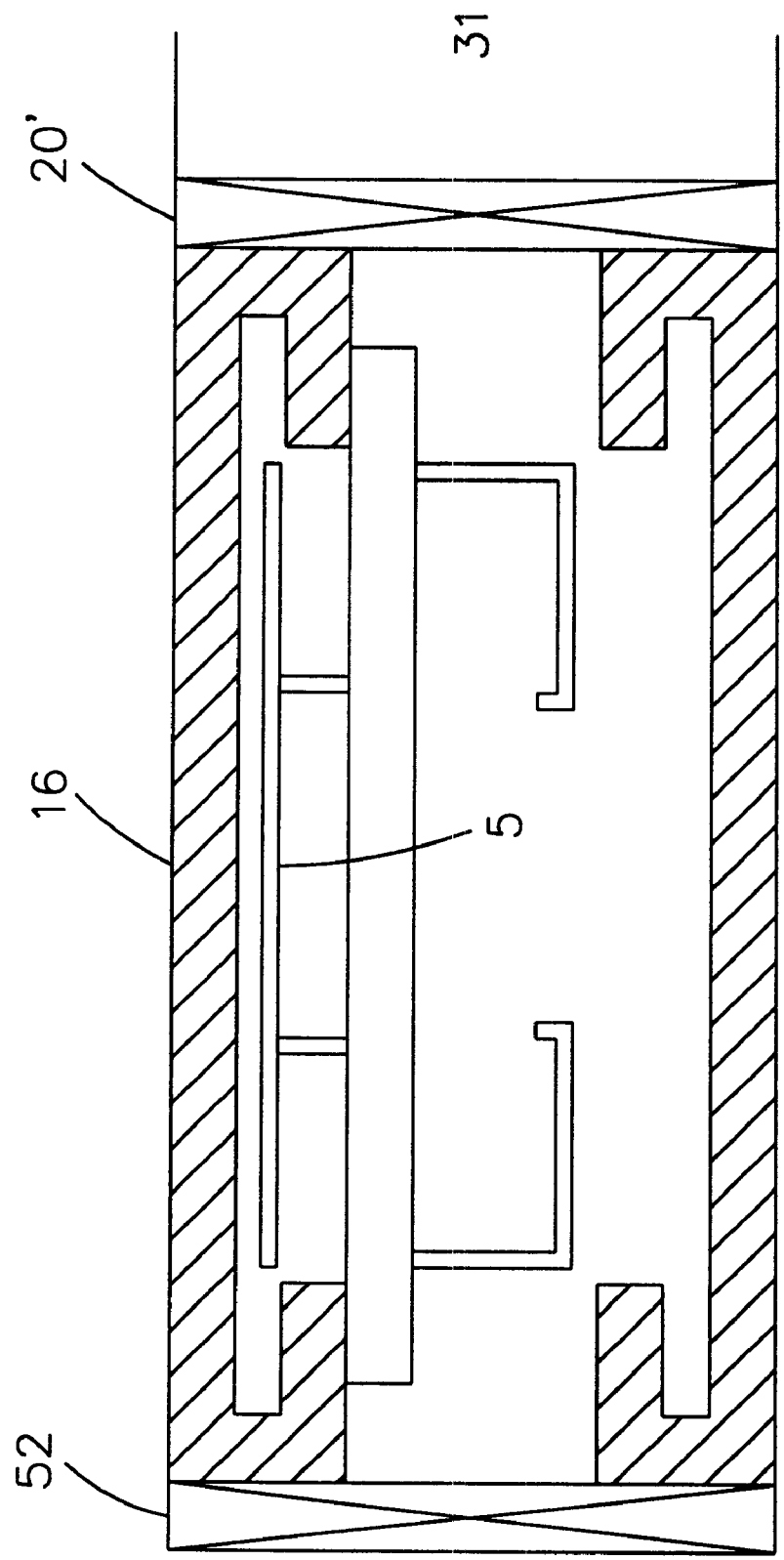

Fast evacuation of remaining chambers 50, 70, and 72, see FIG. 7c. (step 120)

Open internal valve 20'. (step 122)

Figure 7D:
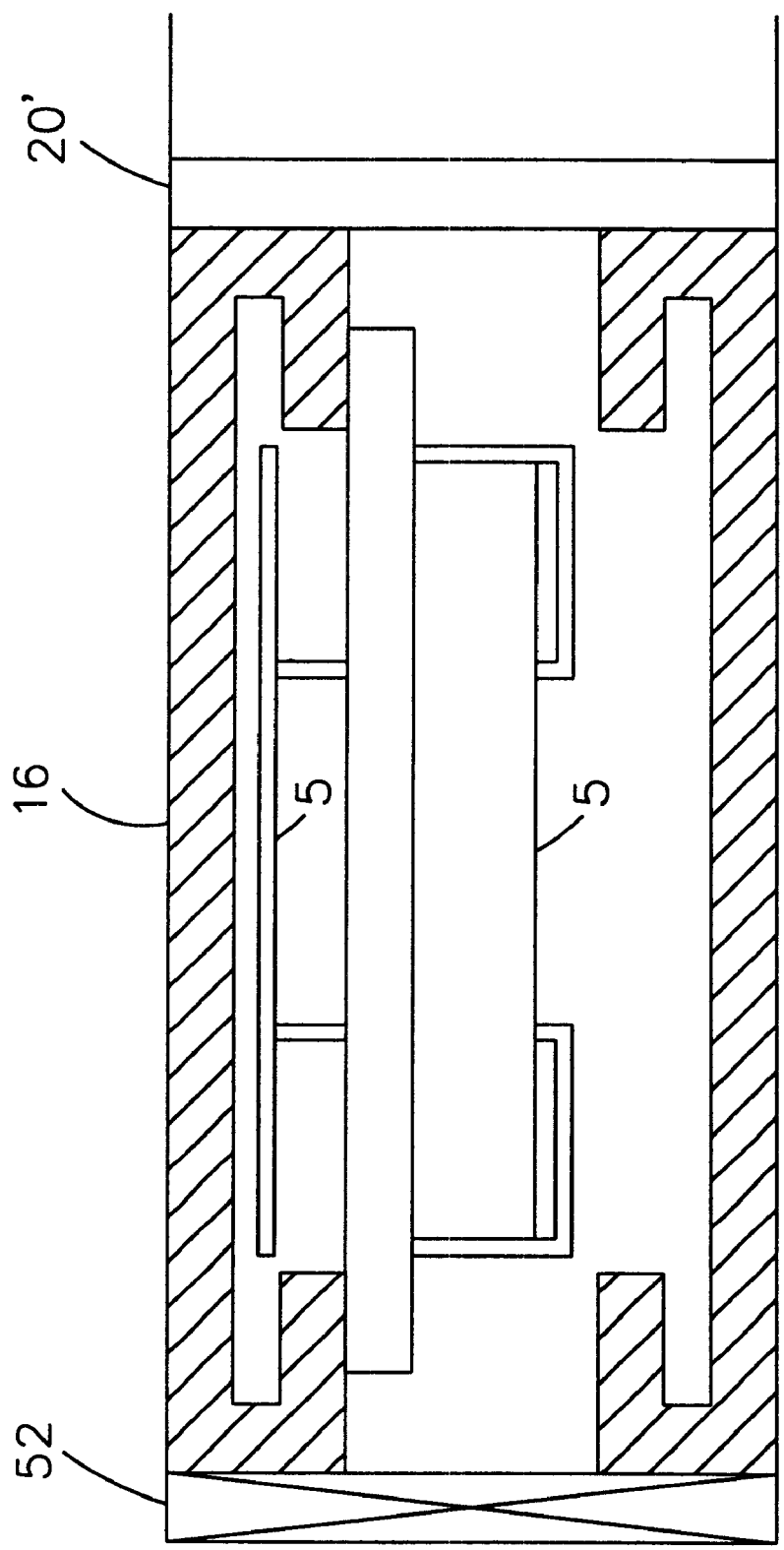

Transport apparatus places processed substrate onto poppet depending members 66, see FIG. 7d. (step 124)

Lower poppet. (step 126)

Transport apparatus picks substrate from top of poppet. (step 128)

Close internal valve 21'. (step 130)

The cooled substrate may be returned to the main processing chamber or may exit the load lock. (step 132).

Thus, the substrate is normally placed onto the platen in the condition shown in FIG. 4 by opening the outside valve 52 to the external environment and maintaining the valve 20' closed to the inner chamber 31 of the transport apparatus. All the while, it should be understood that while loading a substrate from the external environment through the valve 52 it is entirely possible and desirable to maintain a substrate within the upper chamber 70 in a buffer condition. As seen from the above example, such a substrate in the buffer condition in the subchamber 70 could be transported into the chamber 50 of the load lock 16 with the outside valve 52 closed to the external environment and inside valve 20' open to the main chamber 31 of the transport apparatus. In this case, the transport apparatus 22 would move a substrate into the load lock with the poppet in the lowered condition as shown in FIG. 3 and thereafter the poppet can be raised with the substrate placed into a buffer condition. Since the load lock 50 would already be in vacuum, there is no reason to provide vacuum to the subchamber 70 in this scenario.

Assuming a substrate is located in the upper subchamber 70 in a buffer condition and the valve 20' to the main transport chamber is closed and with the outer valve 52 open to the external environment, a substrate can thus be taken out of the load lock from the poppet and if no substrate is to be loaded, the holding members 66 are left empty. Thereafter, the outer chamber valve 52 is closed to the external environment and vacuum applied to the chamber 50 through the vacuum valve 84 in a manner discussed above. With the chamber 50 brought down to vacuum, the inner valve 20' may be open. At this point it may be possible to use the transport apparatus 22 to move a substrate into the load lock chamber 50, if there is no substrate present.

Depending on the application, it is a feature of the invention to allow the substrate in the buffer subchamber 70 to be lowered through the intermediary of the actuator 62 such that it can be picked up and moved by the substrate holder 29. Alternatively, it is well within the purview of the invention to maintain the substrate previously moved to the buffer subchamber 70 or the lower chamber 72 within that-chamber and have the more currently loaded substrate from the apparatus 22 maintained on the last open holders of the poppet.

Another aspect of the invention is provided by the cooling plate 92 located in the lower subchamber 72. The cooling plate 72 provides passive cooling to substrates held on the lower holders 66. Thus, with two such load locks 16,16 as shown in FIG. 1, two cooling cycles are provided by the system. In each cooling cycle, a substrate which has been worked in is moved into the load lock 16 from within the main chamber 31. At this point, the substrate having been processed through one of the process modules 14,14 is very hot and must be cooled prior to making the transition through to the factory interface or back into the main transport chamber 30. This is important because after such processing occurs, the substrate temperatures are elevated to several hundred degrees centigrade. The temperature must be reduced in a controlled manner so that no damage occurs due to thermal shock or nonuniformity.

Thus, with substrate held on the depending holders 66, cooling may be effected. Such cooling may occur simply by lowering the substrate into the lower subchamber 72 so that it is in close proximity with the cooling plate 92. Once the cooling process is complete, the poppet can be raised, assuming chamber 50 is in vacuum, to allow access of the cooled substrate by the handling interface occurring through the then opened valve 52. It should be understood, another important feature of the invention is that during the cooling process which requires the substrate held on the depending holders 66, the chamber 50 can be functional, although not preferred, as a pass through load lock for moving a substrate between the external environment interface outside the valve 52 and the inner main chamber 31 of the transport apparatus.

Figure 8:
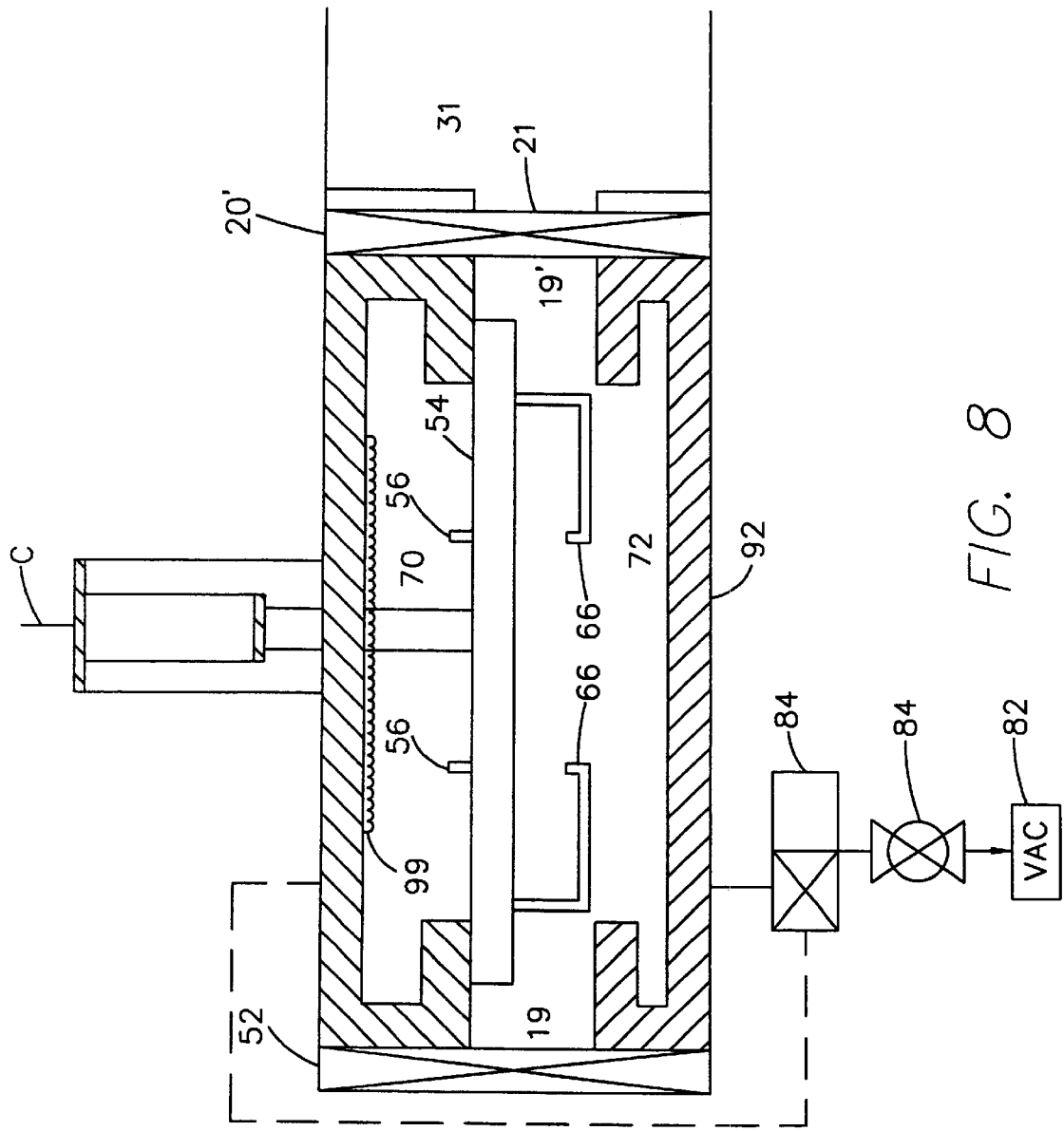
FIG. 8 is an alternate embodiment of a partial fragmentary vertical section taken through the load lock of the present invention showing the substrate platen in its down position.

As illustrated in FIG. 8, one or both of the load locks 16,16 can be modified to include a heating element 99 which is provided within subchamber 70 for heating of the substrate prior to entering a given one of the processing modules 14,14. Thus, with such a load lock, numerous options are available to a system employing such a device(s) given that both heating (within chamber 70) and cooling (within chamber 72) are made possible on different substrates within the same load lock. For example, a new substrate could be loaded into the load lock through exterior valve 52 and onto the elements 56 of the poppet 54. The poppet could then be moved upwards into chamber 70 where slow evacuation and heating takes place. In the meantime, the exterior valve 52 would be closed, the remaining chamber(s) fast evacuated, and the interior valve opened. A processed substrate could be loaded onto the holding members 66 of the raised poppet and then lowered. The heated substrate on the top elements 56 could then be moved off and into the central processing chamber and the cycle would continue much in the same way as explained above with reference to FIGS. 6a and 6b.

By the foregoing an improved single substrate load lock with offset cool module and buffer chamber has been described by way of the aforementioned description. However numerous substitutions and modifications may be had without departing from the spirit of the invention. For example, the upper subchamber 70 or buffer chamber is ideally suited for handling and storing a dummy/cleaning substrate which could be used in the cleaning operation for each of the process modules. Preferably each cleaning operation substrate is only used with one of the modules 14. However, a single dummy/cleaning substrate could also be used to clean multiple processing modules. A cleaning substrate could be maintained a top the standoffs 56,56 and held there until such time a cleaning operation was designated for one of the process modules.

What is claimed is:

1. A load lock comprising:
    a frame forming a first chamber, a second chamber and a third chamber located between said first and second chambers, and at least two doorways out of the frame through the frame at the third chamber;
    a substrate handler movably connected to the frame, the substrate handler being adapted to move a first substrate into said first chamber and close said first chamber from said third chamber, said substrate handler further adapted to hold a second substrate in said third chamber while said first substrate is in said first chamber, said substrate handler being further adapted to move said second substrate into said second chamber and close said second chamber from said third chamber when said first substrate is moved from said first chamber into said third chamber; and
    a heat transfer device in at least one of said chambers for heating or cooling a substrate in said at least one chamber.

2. The apparatus of claim 1 wherein said heat transfer device in at least one of said chambers comprises:
    a substrate heating device in said first chamber; and
    a substrate cooling device in said second chamber.

3. The apparatus of claim 1 wherein said at least two doorways out of the frame through the frame at the third chamber comprise:
    a first gate valve communicating with an interior environment; and
    a second gate valve communicating with an exterior environment.

4. A lock module for use with a main transport chamber having at least one passage therein communicating between an interior environment of the main transport chamber and an outside environment divided from one another by a separation wall extending vertically therebetween, said load lock being connectable to said main transport chamber on the side of said separation wall corresponding to the side of the outside environment and comprising:

an internal chamber communicating with a one opening therein having a first gate valve associated with said outside environment and an oppositely disposed another opening having a second gate valve associated with said interior environment of said main transport chamber;

said internal chamber having a vertically movable member disposed therein;

said internal chamber further communicating with an upper subchamber and a lower subchamber each separated by said vertically movable member;

wherein said vertically movable member is sized so as to overextend an opening defining each of said first and second subchambers so as to cause sealing engagement with the subchamber towards which the vertically member is moved and wherein said first and second gate valves being selectively operable with the raising and lower of said vertically movable member to selectively expose one of said first and second subchambers to one of said interior and outside environments to the exclusion of the other of said first and second subchambers;

wherein said first subchamber is adapted to be selectively sealed from an atmosphere in said internal chamber when said first substrate is moved into said first subchamber and subject said first substrate to a first heat transfer process while a second substrate is loaded onto said vertically movable member; and wherein said second subchamber is adapted to be selectively sealed from the atmosphere in said internal chamber when said second substrate is moved into said second subchamber and subject said second substrate to a second heat transfer process while said first substrate is unloaded from said vertically movable member.

5. A load lock module as defined in claim 1 further characterized by said upper and lower subchambers each having an annular gasket disposed about the intersection between the main chamber and each of said upper and lower subchambers.

6. A load lock module as defined in claim 1 further characterized by said lower subchamber having the cool plate disposed therein with a means for dissipating heat removed from a substrate contained therein.

7. A load lock module as defined in claim 6 further characterized by said vertically movable member being a generally circular plate having a plurality of depending holding members disposed thereon, said depending holding members depending from said plate at radially disposed locations therefrom.

8. A load lock module as defined in claim 7 further characterized by each of said openings defining said first and second subchambers having diameter which is less than the confronting surface area of said vertically movable member.

9. A load lock module as defined in claim 8 further characterized by said lower subchamber having a vacuum line in communication therewith, said vacuum line being connected with a valve for staggered evacuation of air from said lower subchamber.

10. A load lock module as defined in claim 9 further characterized by said module first and second gate valves located coincidentally in a common horizontal plane and are in communication with an opening which has a given width, said given width of said opening being smaller in dimension than the spacing between depending holding members of said vertically moving member.

11. A load lock module as defined in claim 10 further characterized by said upper subchamber having a heating element disposed therein for heating a substrate which is carried by means disposed on the top surface of said vertically movable member.

12. A load lock module as defined in claim 11 further characterized by said depending portions of said holding members having generally inturned laterally extending support portions which are spaced from the lower surface of said vertically movable member to position said support portions in alignment with said first and second gate valves of said module.

13. A load lock module as defined in claim 12 further characterized by said module having an actuator connected to said vertically movable member to position said vertically movable member between a discrete upper position associated with sealing engagement with said upper subchamber and a lower discrete position wherein said vertically movable member is in sealing engagement with said lower subchamber.

14. A load lock module as defined in claim 4 further characterized by said module being dimensioned and having an inner face which is sized to conform to a facet to a central processing apparatus.

15. A load lock module as defined in claim 14 further characterized by providing two load lock modules disposed generally circumferentially about a central processing apparatus.

16. A load lock module as defined in claim 15 further characterized by providing a plurality of processing modules around the perimeter of a central processing apparatus each having a given area such that the given area of one process module is substantially the same as the given area of another process module and each of said first and second lock modules having a footprint which is substantially generally equal to that of the given area of said processing modules.

17. A cluster tool comprising:

a central processing member having a polygonal shape defined by side faces each having a gate valve permitting selective passage of a substrate between an outer environment and an interior environment of the central processing chamber;

at least one processing module associated with one of said side faces of said central processing chamber in selective vacuum communication therewith;

at least one load lock module associated with one of said side faces of said central processing apparatus in selected vacuum communication therewith;

a first gate valve associated with said load lock module for permitting a substrate to pass from an outer environment thereof into said load lock module and a second gate valve associated respectively with said central processing apparatus; and wherein said lock module includes an upper subchamber and a lower subchamber separated by a main chamber having a given height and said main chamber including a vertically movable member having first and second opposite surfaces each respectively associated with one of said upper and lower subchamber such that movement of said vertically movable member between an upper and lower position causes respectively sealing engagement with one of the upper subchamber or the lower subchamber and wherein said first and second gate valves being selectively operable with the raising and lower of said vertically movable member to selectively expose one of said upper and lower subchambers to one of said interior and outside environments to the exclusion of the other of said upper and lower subchambers;

wherein said upper subchamber is adapted to seal a first substrate from an atmosphere in said main chamber while a second substrate is loaded onto said vertically movable member; and wherein said lower subchamber is adapted to seal said second substrate from the atmosphere in said main chamber while said first substrate is unloaded from said vertically movable member.

* * * * *

UNITED STATES PATENT AND TRADEMARK OFFICE
CERTIFICATE OF CORRECTION

PATENT NO.    : 6,530,732 B1                                      Page 1 of 1
DATED         : March 11, 2003
INVENTOR(S)   : Theriault et al.

It is certified that error appears in the above-identified patent and that said Letters Patent is hereby corrected as shown below:

<u>Column 9,</u>
Lines 41 and 46, "claim 1" should read -- claim 4 --

Signed and Sealed this

Seventh Day of October, 2003

JAMES E. ROGAN
*Director of the United States Patent and Trademark Office*